US012635242B2

(12) United States Patent
Lu et al.

(10) Patent No.: US 12,635,242 B2
(45) Date of Patent: May 19, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventors: Qiang Lu, Wuhan (CN); Yingchuan Jiang, Wuhan (CN); Wenxu Xianyu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/799,663

(22) PCT Filed: Jun. 30, 2022

(86) PCT No.: PCT/CN2022/103089
§ 371 (c)(1),
(2) Date: Aug. 13, 2022

(87) PCT Pub. No.: WO2023/240709
PCT Pub. Date: Dec. 21, 2023

(65) Prior Publication Data
US 2024/0194694 A1     Jun. 13, 2024

(30) Foreign Application Priority Data

Jun. 15, 2022    (CN) .......................... 202210680484.3

(51) Int. Cl.
H10D 86/60        (2025.01)
H10D 86/40        (2025.01)
(52) U.S. Cl.
CPC ........... H10D 86/60 (2025.01); H10D 86/443 (2025.01)

(58) Field of Classification Search
CPC ............. H10K 59/1275; H10K 59/131; H10K 59/122; H10K 59/123; H10K 59/124;
(Continued)

(56) References Cited

U.S. PATENT DOCUMENTS 9,312,283 B2 *  4/2016  Nanai ................. H01L 27/1259
2005/0140281 A1 *  6/2005  Park ................... H10K 59/1275
                                                313/506
(Continued)

FOREIGN PATENT DOCUMENTS

CN        104571696 A        4/2015
CN        106229321 A        12/2016
(Continued)

OTHER PUBLICATIONS

International Search Report in International application No. PCT/CN2022/103089, mailed on Dec. 26, 2022.
(Continued)

*Primary Examiner* — Natalia A Gondarenko
(74) *Attorney, Agent, or Firm* — Menachem Nathan; Nathan & Associates

(57)        ABSTRACT

Embodiments of the present disclosure discloses a display panel and a display device. The display panel includes a first substrate, a second substrate disposed opposite the first substrate, a plurality of electrical-connection units located between the first substrate and the second substrate, and a first barrier layer including at least a plurality of first barrier units located between the first substrate and the second substrate, wherein the electrical-connection units electrically connect the first substrate and the second substrate, and one of the first barrier units is disposed to surround one of the electrical-connection units.

19 Claims, 5 Drawing Sheets

(58) Field of Classification Search
CPC .. H10K 59/126; H10K 59/127; H10K 59/173;
H10K 59/80; H10K 59/805; H10K
59/8051; H10K 59/8052; H10K
59/80521; H10K 59/80522; H10K 59/87;
H10K 59/8721; H10K 59/8723; H10K
59/873; H10K 50/84; H10K 50/805;
H10K 50/81; H10K 50/813; H10K 50/82;
H10K 50/822; H10K 50/844; H10K
50/88; H01L 27/1244; H01L 21/76251;
H01L 21/76275; H10D 86/60; H10D
86/40; H10D 86/411; H10D 86/441;
H10D 86/443; H10D 86/451
USPC ......................................... 257/59, 72, 79, 40
See application file for complete search history.

(56) References Cited

U.S. PATENT DOCUMENTS

| | | | | |
|---|---|---|---|---|
| 2007/0159068 | A1 | 7/2007 | Miyake | |
| 2013/0285253 | A1* | 10/2013 | Aoki | H01L 24/05 |
| | | | | 438/455 |
| 2016/0086982 | A1* | 3/2016 | Yamazaki | H10K 59/124 |
| | | | | 257/72 |
| 2017/0162637 | A1* | 6/2017 | Choi | H01L 21/28 |
| 2019/0165060 | A1* | 5/2019 | Choi | H10K 50/844 |
| 2019/0198803 | A1* | 6/2019 | Takayama | H01L 29/78672 |
| 2019/0288049 | A1* | 9/2019 | Takeya | H10K 59/1213 |
| 2023/0132059 | A1* | 4/2023 | Kurokawa | G06N 3/063 |
| | | | | 257/40 |
| 2023/0380228 | A1* | 11/2023 | Kim | H10K 59/1201 |
| 2024/0188351 | A1* | 6/2024 | Wang | H10K 59/124 |
| 2024/0414940 | A1* | 12/2024 | Maeda | H10K 59/131 |

FOREIGN PATENT DOCUMENTS

| | | |
|---|---|---|
| CN | 109638054 A | 4/2019 |
| CN | 109671859 A | 4/2019 |
| CN | 110518053 A | 11/2019 |
| CN | 111951682 A | 11/2020 |
| CN | 112002823 A | 11/2020 |
| CN | 113053923 A | 6/2021 |
| CN | 113133328 A | 7/2021 |
| CN | 113498553 A | 10/2021 |
| CN | 114156286 A | 3/2022 |

OTHER PUBLICATIONS

Written Opinion of the International Search Authority in International application No. PCT/CN2022/103089, mailed on Dec. 26, 2022.
Chinese Office Action issued in corresponding Chinese Patent Application No. 202210680484.3 dated Sep. 24, 2024, pp. 1-8.
Chinese Office Action issued in corresponding Chinese Patent Application No. 202210680484.3 dated Mar. 31, 2025, pp. 1-6.

* cited by examiner

FIG. 9

DISPLAY PANEL AND DISPLAY DEVICE

TECHNICAL FIELD

The present disclosure relates to a display field, and more particularly, to a display panel and a display device.

BACKGROUND

In recent years, in a display panel, circuit lines originally in a frame area are placed in a display area, and an upper substrate and a lower substrate are electrically connected through an electrical-connection unit. A main body of the electrical-connection unit usually includes metal materials with high conductivity. The intrusion of water and oxygen to these metal materials will intensify at a high-temperature or high-humidity environment and under the action of an electric current or electric field. Thus, these metal materials will be ionized, and migrate and diffuse. With the accumulation of metal ion migration, a quality loss occurs in the electrical-connection unit, and voids occur, resulting in increased resistance and performance degradation. At the same time, metal bridges are easy to occur between adjacent electrical-connection units, which will lead to short circuits and damage to the display panel.

Accordingly, there is a need for a display panel and a display device to solve the above-mentioned technical problem.

Technical Problems

The present disclosure provides a display panel and a display device, which can alleviate the technical problem of serious moisture-oxygen penetration of film layers around an electrical-connection unit.

Technical Solutions

To solve the above problem, the present disclosure provides the following technical solutions:

An embodiment of the present disclosure provides a display panel comprising:

a first substrate;

a second substrate disposed opposite to the first substrate;

a plurality of electrical-connection units located between the first substrate and the second substrate, to electrically connect the first substrate with the second substrate; and a first barrier layer comprising at least a plurality of first barrier units located between the first substrate and the second substrate;

wherein one of the first barrier units is disposed to surround one of the electrical-connection units.

Preferably, the first barrier layer is disposed in contact with an inorganic film layer in the first substrate, and the first barrier layer is disposed in contact with an inorganic film layer in the second substrate.

Preferably, the first substrate comprises a plurality of first terminals, one of which is corresponded with and connected to one of the electrical-connection units: the second substrate comprises a plurality of second terminals, one of which is corresponded with and connected to one of the electrical-connection units: an insulating layer located on a side of each of the second terminals away from the first substrate, wherein the insulating layer comprises a plurality of first openings that respectively expose the second terminals: a conductive line layer located in the first openings, wherein the conductive line layer is electrically connected to any of the second terminals: and a second barrier layer located on a side surface of the conductive line layer close to the first substrate, and wherein the second barrier layer comprises at least a plurality of second barrier units respectively disposed on sidewalls of the first openings.

Preferably, the second substrate further comprises a first organic layer located on a side of the insulating layer close to the first substrate: the first organic layer comprises a plurality of second openings and a plurality of third openings: and the first barrier layer further comprises a plurality of third barrier units respectively filled in the third openings: and wherein the second openings respectively expose the second terminals, one of the first openings is corresponded with and connected to one of the second openings, and the third openings expose an inorganic film layer in the insulating layer.

Preferably, the first barrier units are disposed integrally with the third barrier units.

Preferably, the insulating layer comprises a first inorganic layer, a second inorganic layer, and a second organic layer located between the first inorganic layer and the second inorganic layer, and the second inorganic layer is located on a side of the second organic layer away from the first substrate: wherein the second barrier units are disposed integrally with the second inorganic layer, and a material of each of the second barrier units is the same as that of the second inorganic layer.

Preferably, a material of each of the second barrier units comprises any one or a combination of more than one of $SiO_2$, $ZrO_2$, $Al_2O_3$, $TiO_2$, Au, and Pt.

Preferably, two adjacent ones of the first barrier units are disposed spaced apart from each other.

Preferably, a width of each of the first barrier units gradually increases in a direction from a center of the display panel to an edge or edges of the display panel.

Preferably, the display panel further comprises a flexible transparent unit located between two adjacent ones of the first barrier units.

Preferably, two adjacent ones of the first barrier units are disposed in contact with each other.

Preferably, a material of each of the first barrier units comprises any one or a combination of more than one selected from glass frit, epoxy resin, acrylate resin, polyurethane, and organosilicon.

An embodiment of the present disclosure further provides a display device including a display panel and a device body, wherein the device body is integrated with the display panel:

wherein the display panel comprises:

a first substrate;

a second substrate disposed opposite to the first substrate;

a plurality of electrical-connection units located between the first substrate and the second substrate, to electrically connect the first substrate with the second substrate; and a first barrier layer comprising at least a plurality of first barrier units located between the first substrate and the second substrate; and wherein one of the first barrier units is disposed to surround one of the electrical-connection units.

Preferably, the first barrier layer is disposed in contact with an inorganic film layer in the first substrate, and the first barrier layer is disposed in contact with an inorganic film layer in the second substrate.

Preferably, the first substrate comprises a plurality of first terminals, and one of the first terminals is corresponded with and connected to one of the electrical-connection units;

wherein the second substrate comprises a plurality of second terminals, one of which is corresponded with and connected to one of the electrical-connection units; an insulating layer located on a side of each of the second terminals away from the first substrate, wherein the insulating layer comprises a plurality of first openings that respectively expose the second terminals; a conductive line layer located in the first openings, wherein the conductive line layer is electrically connected to any of the second terminals: and a second barrier layer located on a side surface of the conductive line layer close to the first substrate, and wherein the second barrier layer comprises at least a plurality of second barrier units respectively disposed on sidewalls of the first openings.

Preferably, the second substrate further comprises a first organic layer located on a side of the insulating layer close to the first substrate; the first organic layer comprises a plurality of second openings and a plurality of third openings; the first barrier layer further comprises a plurality of third barrier units respectively filled in the third openings; wherein the second openings respectively expose the second terminals, one of the first openings is corresponded with and connected to one of the second openings, and the third openings expose an inorganic film layer in the insulating layer.

Preferably, the first barrier units are disposed integrally with the third barrier units.

Preferably, the insulating layer comprises a first inorganic layer, a second inorganic layer, and a second organic layer located between the first inorganic layer and the second inorganic layer, and the second inorganic layer is located on a side of the second organic layer away from the first substrate; wherein the second barrier units are disposed integrally with the second inorganic layer, and a material of each of the second barrier units is the same as that of the second inorganic layer.

Preferably, two adjacent ones of the first barrier units are disposed spaced apart from each other.

Preferably, the display panel further comprises a flexible transparent unit located between two adjacent ones of the first barrier units.

Beneficial Effects

In the present disclosure, by disposing the first barrier units to surround the electrical-connection units outside of the electrical-connection units, the moisture-oxygen penetration is alleviated by the first barrier units, and meanwhile the ion diffusion caused by the moisture-oxygen penetration between two adjacent ones of the electrical-connection units is avoided, thereby improving the stability of the electrical-connection units, prolonging the life spans of the electrical-connection units, and improving the display effect.

BRIEF DESCRIPTION OF THE DRAWINGS

FIG. 9 is a structural schematic view of a display device according to an embodiment of the present disclosure.

EMBODIMENTS OF THE PRESENT INVENTION

Figure 1:
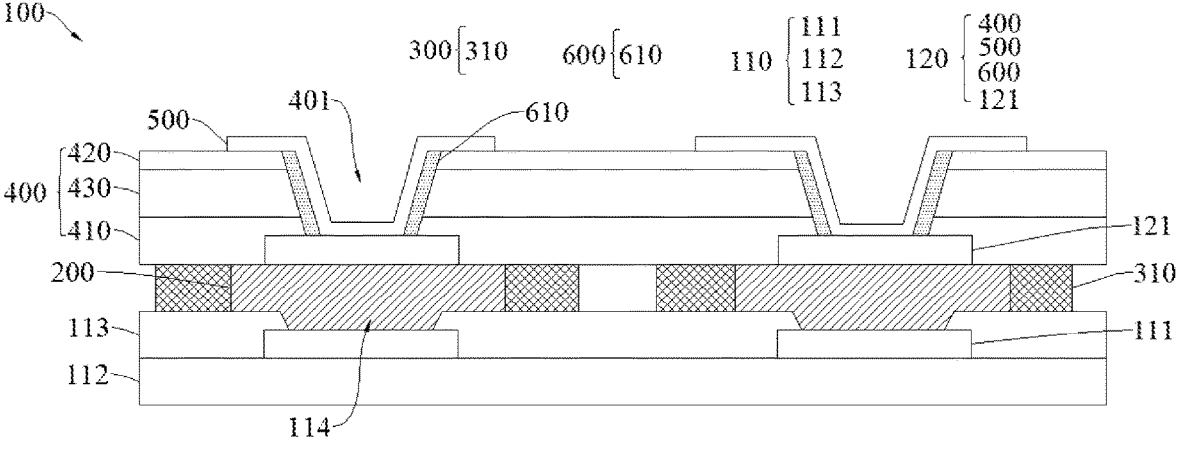
FIG. 1 is a structural schematic view of a first configuration of a display panel according to an embodiment of the present disclosure.

The present disclosure provides a display panel and a display device. In order to make the objective, technical solution and effect of the present disclosure more explicit and clearer, the present disclosure will be described in further detail below with reference to the accompanying drawings and embodiments. It is to be understood that specific embodiments described herein are merely used to illustrate the present disclosure and are not intended to limit the present disclosure.

Embodiments of the present disclosure provide a display panel and a display device. Detailed descriptions are described below. It should be noted that the order in which the following embodiments are described is not intended to limit the preferred order of the embodiments.

Referring to FIGS. 1-8, an embodiment of the present disclosure provides a display panel 100 including:

a first substrate 110;

a second substrate 120 disposed opposite to the first substrate 110;

a plurality of electrical-connection units 200 located between the first substrate 110 and the second substrate 120, to electrically connect the first substrate 110 with the second substrate 120; and a first barrier layer 300 including at least a plurality of first barrier units located between the first substrate 110 and the second substrate 120;

wherein one of the first barrier units 310 is disposed to surround one of the electrical-connection units 200.

In the present disclosure, by disposing the first barrier units to surround the electrical-connection units, moisture-oxygen penetration is alleviated by the first barrier units, and meanwhile an ion diffusion due to the moisture-oxygen penetration between two adjacent ones of the electrical-connection units is avoided, thereby improving stability of the electrical-connection units, prolonging life spans of the electrical-connection units, and improving a display effect.

Technical solutions of the present disclosure are described with reference to specific embodiments.

In the present embodiment, referring to FIG. 1, the display panel 100 includes the first substrate 110, the second substrate 120 disposed opposite the first substrate 110, the plurality of electrical-connection units 200 located between the first substrate 110 and the second substrate 120, and a first barrier layer 300. The first barrier layer 300 includes at least the plurality of first barrier units 310 located between the first substrate 110 and the second substrate 120. The electrical-connection units 200 electrically connect the first substrate 110 with the second substrate 120. The first barrier layer 300 includes the plurality of first barrier units 310, and one of the first barrier unit 310 is disposed to surround one of the electrical-connection units 200.

The first barrier layer 300 is disposed in contact with the electrical-connection units 200. When the first substrate 110 and the second substrate 120 are aligned and bonded, a gap is inevitably presented therebetween, which aggravates the moisture-oxygen penetration. The first barrier units 310 are disposed on the periphery of at least one of the electrical-connection units 200. The first barrier units 310 facilitates obstructing penetration of moisture and/or oxygen into the electrical-connection units 200, while avoiding the ion diffusion between each of the electrical-connection units 200 and surrounding electrical-connection units 200 thereof, improving the stability of the electrical-connection units 200, prolonging the life spans of the electrical-connection units 200, and improving the display effect.

In some embodiments, referring to FIG. 1, the first barrier layer 300 is disposed in contact with an inorganic film layer in the first substrate 110, and the first barrier layer 300 is disposed in contact with an inorganic film layer in the second substrate 120.

The inorganic film layers each has a better moisture-oxygen barrier capability. The first barrier layer 300 is disposed in contact with the inorganic film layers, to further improve the blocking of a moisture-oxygen penetration path, improve the moisture-oxygen barrier capability, improve the stability of the electrical-connection units 200, prolong the life spans of the electrical-connection units 200, and improve the display effect.

In some embodiments, referring to FIG. 1, the first substrate 110 includes a plurality of first terminals 111, and one of the first terminals 111 is corresponded with and connected to one of the electrical-connection units 200: the second substrate 120 includes a plurality of second terminals 121, one of which is corresponded with and connected to one of the electrical-connection units 200; an insulating layer 400 located on a side of each of the second terminals 121 away from the first substrate 110 includes a plurality of first openings 401 that respectively expose the second terminals 121: a conductive line layer 500 located in the first openings 401 is electrically connected to the second terminals 121: and a second barrier layer 600 located on a side surface of the conductive line layer 500 close to the first substrate 110 includes at least a plurality of second barrier units 610 respectively disposed on sidewalls of the first openings 401.

The conductive line layer 500 may include a plurality of conductive lines. The insulating layer 400 may include a plurality of film layers. Meanwhile, the conductive line layer 500 in the first openings 401 of the insulating layer 400 is easily corroded by the moisture and/or oxygen. The second barrier units 610 are disposed in the first openings 401 to block the moisture-oxygen penetration path, thereby protecting the conductive line layer 500. The moisture-oxygen penetration is alleviated by the second barrier unit 610, so that the conductive line layer 500 is prevented from being corroded by the moisture and/or oxygen, and thus the electrical-connection units 200 are prevented from being corroded. Meanwhile, ion diffusion between two adjacent conductive lines of the conductive line layer 500 is avoided. Therefore, stability of the conductive line layer 500 is improved, a life span of the conductive line layer 500 is prolonged, and the display effect is improved.

Figure 2:
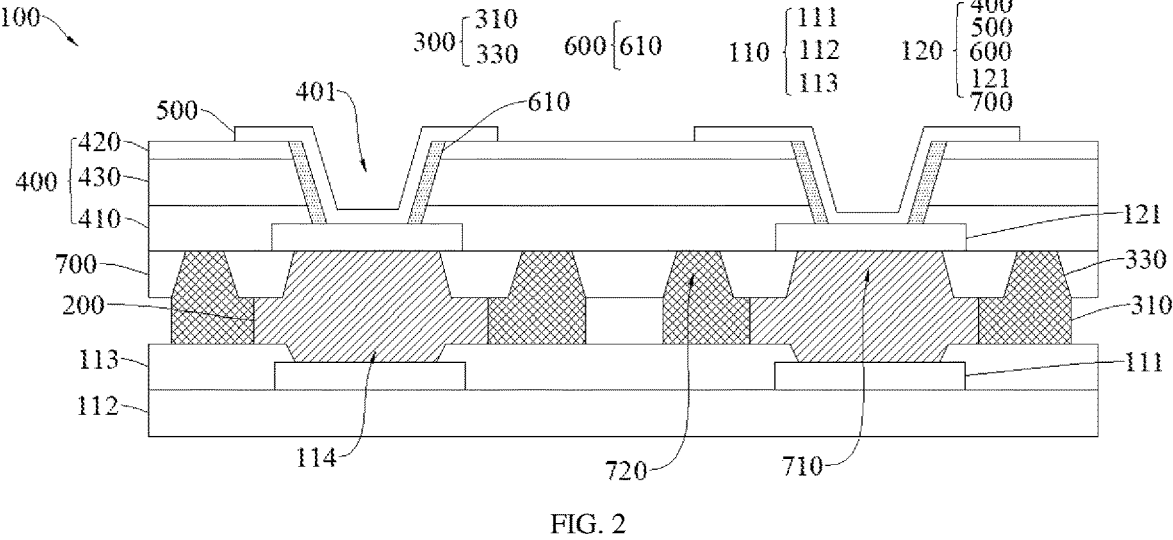
FIG. 2 is a structural schematic view of a second configuration of a display panel according to an embodiment of the present disclosure.

In some embodiments, referring to FIG. 2, the second substrate 120 further includes a first organic layer 700 located on a side of the insulating layer 400 close to the first substrate 110, and the first organic layer 700 includes a plurality of second openings 710 and a plurality of third openings 720. The first barrier layer 300 further includes a plurality of third barrier units 330 respectively filled in the third openings 720. The second openings 710 respectively expose the second terminals 121. One of the first openings 401 is corresponded with and connected to one of the second openings 710. The third openings 720 expose the inorganic film layer in the insulating layer 400.

When the first organic layer 700 is added onto the second substrate 120, a moisture-oxygen penetration path on a side of the first organic layer 700 close to the insulating layer 400 is increased. The third openings 720 are formed in the first organic layer 700, and the third barrier units 330 are respectively filled in the third openings 720, so that the penetration of the moisture and/or oxygen into the electrical-connection units 200 is further prevented, the life spans of the electrical-connection units 200 are prolonged, and the display effect is improved.

In some embodiments, the first barrier units 310 are respectively disposed integrally with the third barrier units 330.

The first barrier units 310 are disposed integrally with the third barrier units 330, so that the moisture-oxygen barrier capability for the gap between the first substrate 110 and the second substrate 120 can be improved, and the ion diffusion between each of the electrical-connection units 200 and surrounding electrical-connection units 200 thereof is avoided, thereby improving the stability of the electrical-connection units 200, prolonging the life spans of the electrical-connection units 200, and improving the display effect.

In some embodiments, the first barrier layer 300 is disposed integrally with the inorganic film layer in the first substrate 110 in contact with the first barrier layer 300, or the first barrier layer 300 may be disposed integrally with the inorganic film layer in the second substrate 120 in contact with the first barrier layer 300. The first barrier layer 300 includes an inorganic material, and is formed together with the inorganic film layer(s) in the same process, thereby reducing process steps, enhancing the integrity for the moisture-oxygen barrier capability, further prolonging the life spans of the electrical-connection units 200, and improving the display effect.

Figure 4:
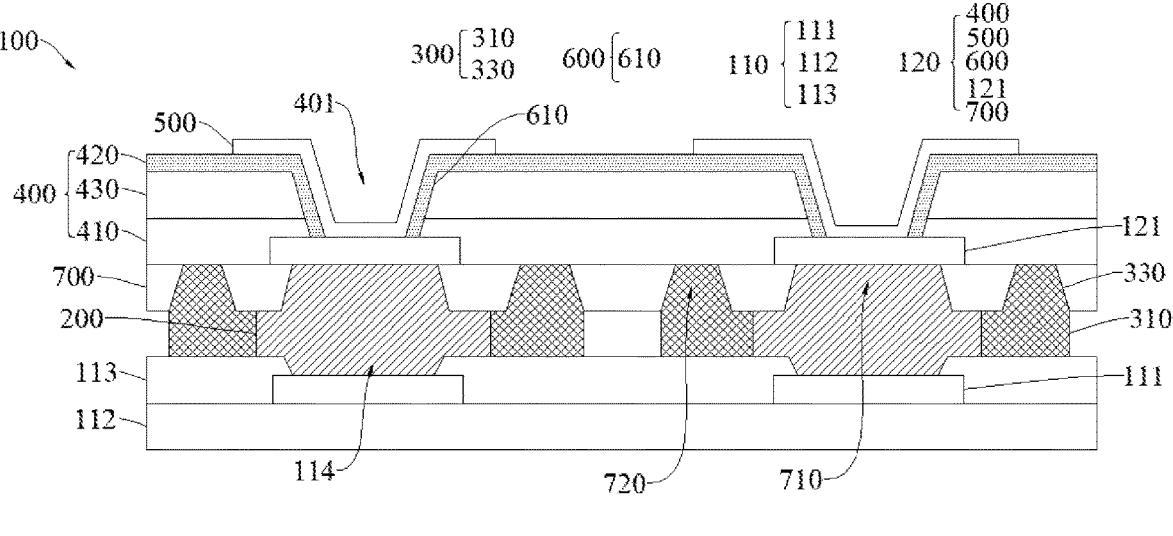
FIG. 4 is a structural schematic view of a fourth configuration of a display panel according to an embodiment of the present disclosure.
Figure 5:
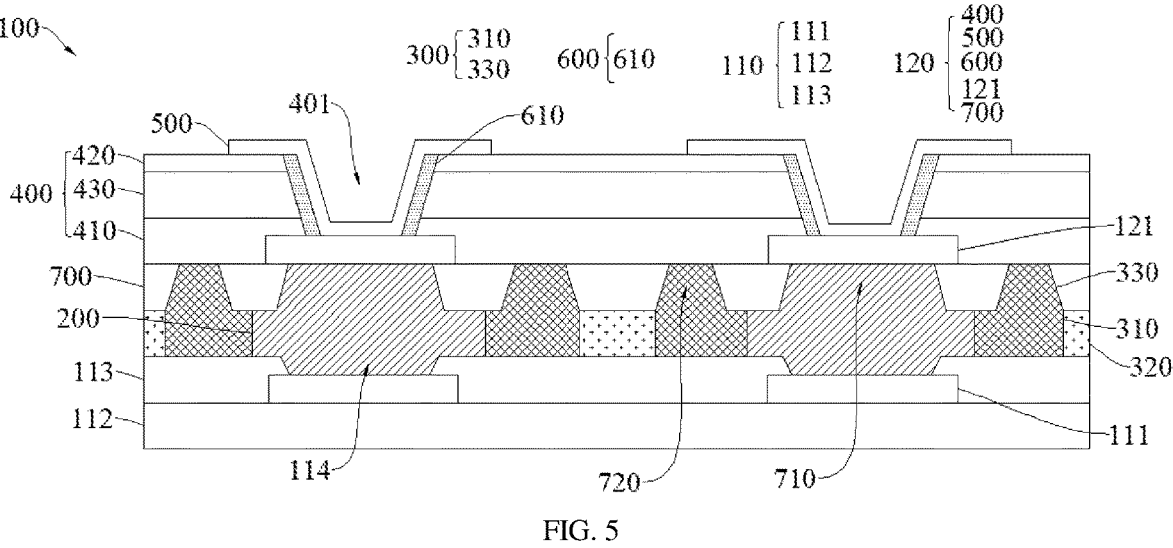
FIG. 5 is a structural schematic view of a fifth configuration of a display panel according to an embodiment of the present disclosure.

In some embodiments, referring to FIGS. 2, 4, and 5, a surface area of a side of each of the first barrier units 310 close to a corresponding third barrier unit 330 is larger than a surface area of a side of each of the third barrier units 330 close to a corresponding first barrier unit. The third openings 720 are respectively located farther away from a position that one of the electrical-connection unit 200 is located, and thus it is less difficult to ensure an opening accuracy, so that the moisture-oxygen barrier effect may be achieved and the production cost may be reduced.

Figure 6:
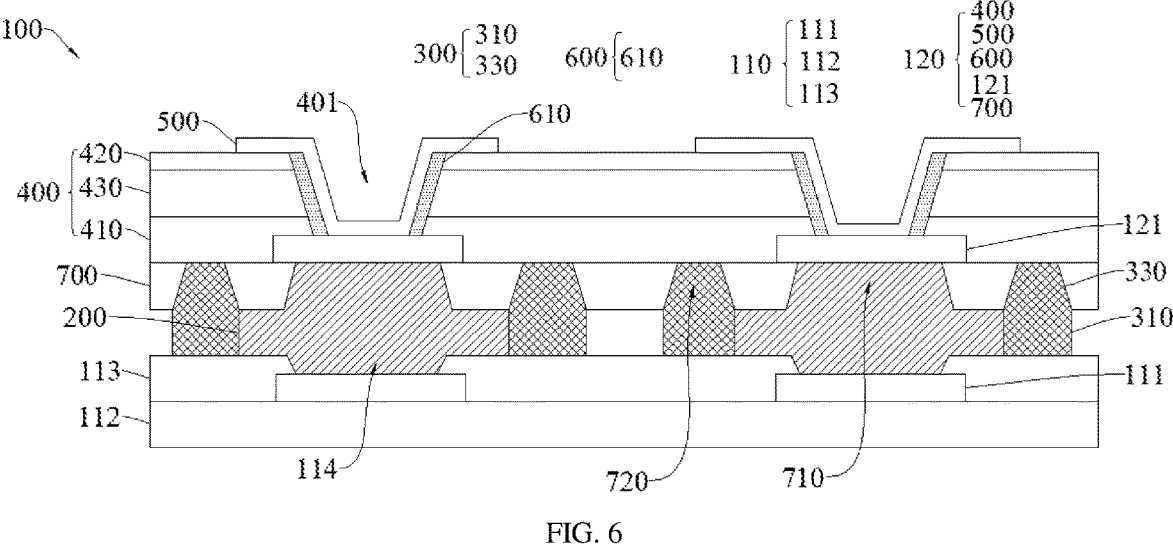
FIG. 6 is a structural schematic view of a sixth configuration of a display panel according to an embodiment of the present disclosure.

In some embodiments, referring to FIG. 6, the surface area of the side of each of the first barrier units 310 close to the corresponding third barrier unit 330 is equal to the surface area of the side of each of the third barrier units 330 close to the corresponding first barrier unit. By accurately positioning the third opening 720, a contact area between the first barrier layer 300 and the first organic layer 700 is further reduced, a risk of the moisture-oxygen penetration is reduced, the life spans of the electrical-connection units 200 is further prolonged, and the display effect is improved.

In some embodiments, referring to FIGS. 1 and 2, the second barrier units 610 may be formed separately.

In some embodiments, a material of each of the second barrier units 610 includes any one or a combination of more than one of $SiO_2$, $ZrO_2$, $Al_2O_3$, $TiO_2$, Au, and Pt.

Figure 3:
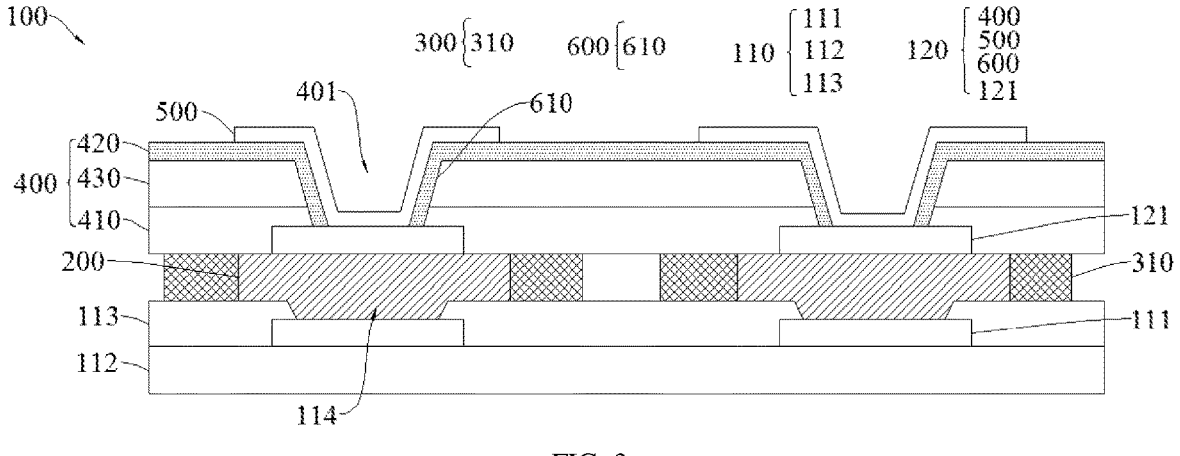
FIG. 3 is a structural schematic view of a third configuration of a display panel according to an embodiment of the present disclosure.

In some embodiments, referring to FIGS. 3 and 4, the insulating layer 400 includes a first inorganic layer 410, a second inorganic layer 420, and a second organic layer 430 located between the first inorganic layer 410 and the second inorganic layer 420. The second inorganic layer 420 is located on a side of the second organic layer 430 away from the first substrate 110. The second barrier units 610 are disposed integrally with the second inorganic layer 420, and the material of each of the second barrier units 610 is the same as that of the second inorganic layer 420.

The second barrier units 610 may be formed together with the second inorganic layer 420 in the same process to simplify the process, the integrity of the second inorganic layer 420 may be improved, and the moisture-oxygen penetration paths may be blocked. Therefore, the conductive line layer 500 is prevented from being corroded by moisture and/or oxygen. Further, the electrical-connection units 200 are prevented from being corroded, the moisture-oxygen is further prevented from being penetrated into the electrical-connection units 200. The ion diffusion between each of the electrical-connection units 200 and surrounding electrical-connection units 200 thereof is prevented. The stability of the electrical-connection units 200 is improved. The life spans of the electrical-connection units 200 are prolonged. The display effect is improved.

In some embodiments, referring to FIGS. 1 to 5, the first substrate 110 further includes a third inorganic layer 113 located on a side of the first terminals 111 close to the second substrate 120. The third inorganic layer 113 includes a plurality of fourth openings 114 that respectively expose the first terminals 111. The electrical-connection units 200 are electrically connected to the first terminals 111 through the fourth openings 114, respectively.

In some embodiments, the second barrier unit 610 merely covers a gap between the first inorganic layer 410 and the first organic layer 700 and a gap between the second inorganic layer 420 and the first organic layer 700 within each of the first openings 401.

The second barrier units 610 cover the gaps between film layers. Thus, the moisture-oxygen barrier capability of the entire display panel 100 is enhanced. The stability of the electrical-connection units 200 is improved. The life spans of the electrical-connection units 200 are prolonged. The display effect is improved.

In some embodiments, each of the second barrier units 610 covers an entire sidewall(s) of each of the first openings 401.

In some embodiments, the second barrier units 610 each includes a first portion located within one of the first openings 401 and a second portion extending to an outside of the first opening 401, wherein the first portion is connected to the second portion.

The second portion is located between the insulating layer 400 and the conductive line layer 500, and has a better protection effect for the conductive line layer 500 located outside the first openings 401, so that the conductive line layer 500 is prevented from being corroded by the moisture and/or oxygen, and thus the electrical-connection units 200 are prevented from being corroded. Further, the moisture and/or oxygen is prevented from penetrating into the electrical-connection units 200. Meanwhile, the ion diffusion between each of the electrical-connection units 200 and surrounding electrical-connection units 200 thereof is avoided. The stability of the electrical-connection units 200 is improved, the life spans of the electrical-connection units 200 are prolonged, and the display effect is improved.

Figure 7:
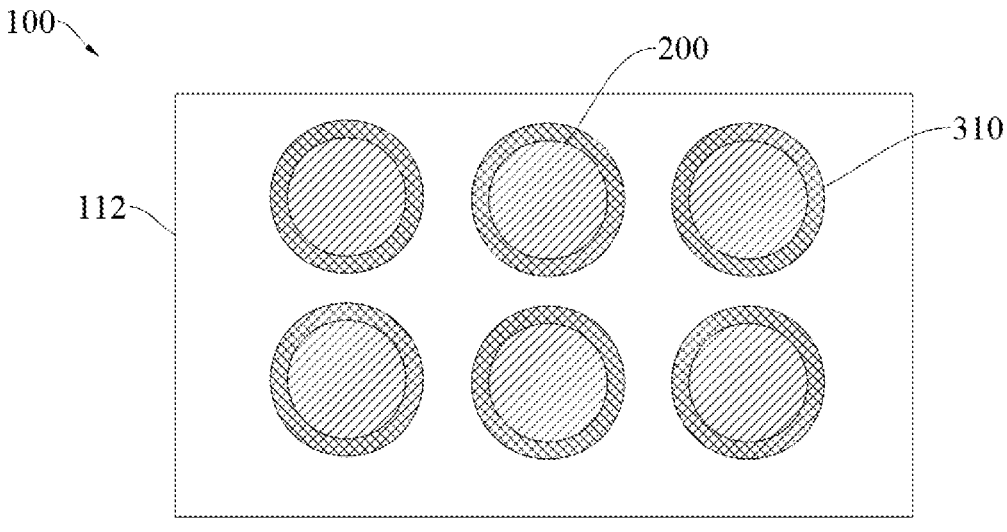
FIG. 7 is a top schematic view of a seventh structure of a display panel according to an embodiment of the present disclosure.
Figure 8:
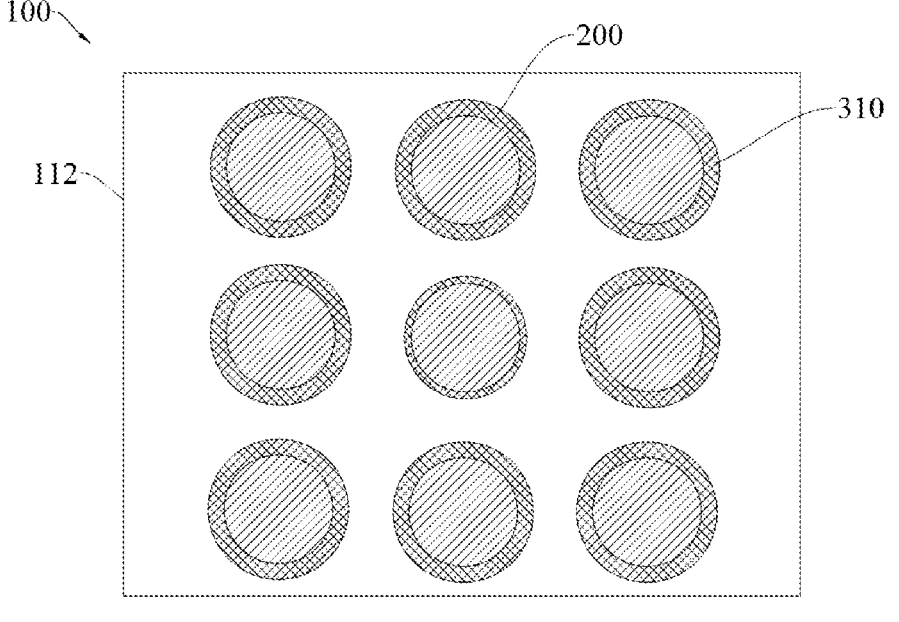
FIG. 8 is a top schematic view of an eighth configuration of a display panel according to an embodiment of the present disclosure.

In some embodiments, referring to FIGS. 7 and 8, any two adjacent ones of the first barrier units 310 are disposed spaced apart from each other. The first barrier units 310 are disposed spaced apart from each other, to further reduce the ion diffusion between two adjacent ones of the electrical-connection units 200. Therefore, the stability of the electrical-connection units 200 is improved, the life spans of the electrical-connection units 200 are prolonged, and the display effect is improved.

In some embodiments, referring to FIG. 8, a width of each of the first barrier units 310 gradually increases in a direction from a center of the display panel 100 to an edge or edges of the display panel 100.

The larger the width of the first barrier units 310 is, the stronger the moisture-oxygen barrier capability is. The edges of the display panel 100 are more easily corroded by the moisture and/or oxygen. In the direction from the center of the display panel 100 to the edge of the display panel 100, the width of the first barrier units 310 gradually increases, so that the moisture-oxygen barrier capability of the entire display panel 100 may be enhanced. The stability of the electrical-connection units 200 is improved. The life spans of the electrical-connection units 200 are prolonged. The display effect is improved.

In some embodiments, an arrangement density of the first barrier unit 310 gradually increases in the direction from the center of the display panel 100 to the edges of the display panel 100.

The first barrier units 310 may not be disposed around the electrical-connection unit 200 in the center direction of the display panel 100. The first barrier units 310 merely are disposed at the edges of the display panel 100. As a result, the moisture-oxygen barrier capability of the entire display panel 100 may be enhanced. The stability of the electrical-connection units 200 is improved. The life spans of the electrical-connection units 200 are prolonged. The display effect is improved.

In some embodiments, one of the electrical-connection units 200 corresponds to one of the barrier units. In the direction from the center of the display panel 100 to the edges of the display panel 100, an arrangement density of the electrical-connection unit 200 is increased, so that the arrangement density of the first barrier units 310 is increased. As a result, the moisture-oxygen barrier capability of the entire display panel 100 can also be enhanced. The stability of the electrical-connection units 200 is improved. The life spans of the electrical-connection units 200 are prolonged. The display effect is improved.

In some embodiments, referring to FIG. 5, the display panel 100 further includes a flexible transparent unit 320 located between two adjacent ones of the first barrier units 310.

The flexible transparent unit 320 is filled between the first barrier units 310 spaced apart from each other. The overall flexibility of the display panel 100 may be increased by the flexible transparent unit 320. A material of the flexible transparent unit 320 includes an insulating transparent material, such as a liquid optical adhesive or the like, and is not specifically limited herein.

In some embodiments, two adjacent ones of the first barrier units 310 are disposed in contact with each other. The first barrier unit 310 may be integrated to form a whole face.

Thus, the process is simplified. A length of the moisture-oxygen penetration path is maximized, and the display panel 100 is protected.

In some embodiments, a material of each of the first barrier units 310 includes any one or a combination of more than one of glass frit, epoxy resin, acrylate resin, polyurethane, and organic silicon(e).

The material of each of the first barrier units 310 includes a composite material having a low water vapor transmission rate and a low oxygen transmission rate as a base material. The first barrier units 310 have a viscous fluid and may be formed by printing, dispensing, ink-jetting or spraying processes, and thermal curing or UV curing processes.

In some embodiments, referring to FIGS. 1 to 6, the first substrate 110 includes a first body 112 on a side of the third inorganic layer 113 away from the second substrate 120.

In some embodiments, the first substrate 110 may be a driving substrate. The first body 112 includes a substrate, an active layer located on the substrate, a first insulating layer located on the active layer, a gate layer located on the first insulating layer, a second insulating layer located on the gate layer, a source/drain layer located on the second insulating layer, and a third insulating layer located on the source/drain layer.

In some embodiments, the second substrate 120 may be a light emitting substrate. The second substrate 120 further includes a light emitting device layer including an anode layer electrically connected to the conductive line layer 500, a light emitting material layer located on the anode layer, and a cathode layer located on the light emitting material layer.

The display panel 100 further includes a pixel definition layer disposed in the same layer as the light-emitting material layer, a polarizing layer located on the light emitting device layer, and a flexible cover plate located on the polarizing layer. The display panel 100 further includes a corresponding adhesive layer located between the polarizing layer and the flexible cover plate.

In some embodiments, the light emitting device layer may include an OLED (Organic Light Emitting Diode) material, or may include Micro LED or Mini LED, which are not specifically limited herein.

In the present disclosure, by disposing the first barrier units to surround the electrical-connection units at the periphery of the electrical-connection units, the moisture-oxygen penetration is alleviated by the first barrier units, and meanwhile the ion diffusion between two adjacent ones of the electrical-connection units is avoided, thereby improving the stability of the electrical-connection units, prolonging the life spans of the electrical-connection units, and improving the display effect.

Figure 9:
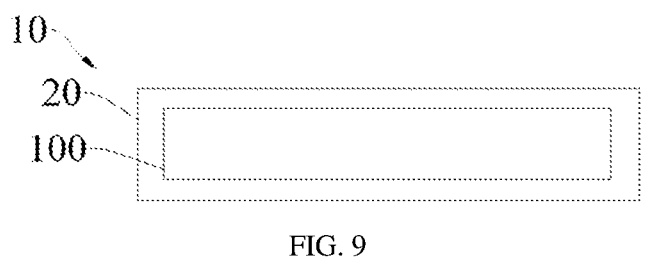

Referring to FIG. 9, an embodiment of the present disclosure further provides a display device 10. The display device 10 includes any of the display panels 100 as described above and a device main body 20. The device main body 20 is integrated with the display panel 100.

A specific structure of the display panel 100 is described with reference to the embodiment(s) and the accompanying drawing(s) of any of the above-described display panels 100, and details are not repeated herein.

In the present embodiment, the device main body 20 may include a middle frame, a frame glue, and the like. The display device 10 may be a display terminal such as a mobile phone, a tablet, a television, or the like, which is not limited herein.

An embodiment of the present disclosure discloses a display panel and a display device. The display panel includes a first substrate, a second substrate disposed opposite the first substrate, a plurality of electrical-connection units located between the first substrate and the second substrate, and a first barrier layer including at least a plurality of first barrier units located between the first substrate and the second substrate. The electrical-connection units electrically connect the first substrate with the second substrate. One of the first barrier units is disposed to surround one of the electrical-connection units. In the present disclosure, by disposing the first barrier units to surround the electrical-connection units at the periphery of the electrical-connection units, the moisture-oxygen penetration is alleviated by the first barrier units, and meanwhile the ion diffusion between two adjacent ones of the electrical-connection units is avoided, thereby improving the stability of the electrical-connection units, prolonging the life spans of the electrical-connection units, and improving the display effect.

It will be appreciated by those of ordinary skill in the art that equivalent substitutions and changes may be made in accordance with technical solutions of the present disclosure and its inventive concept, and all such changes or substitutions are intended to fall within the scope of the claims appended hereto.

What is claimed is:

1. A display panel, comprising:

a first substrate, comprising first terminals at an upper surface of the first substrate;

a second substrate disposed opposite to the first substrate in a first direction perpendicular to the upper surface of the first substrate, wherein the second substrate comprises second terminals at a lower surface of the second substrate close to the upper surface of the first substrate and a light emitting device layer connected to at least one of the second terminals;

a plurality of electrical-connection units respectively located between the first terminals and the second terminals in the first direction, to electrically connect the first substrate with the second substrate by electrically connecting the first terminals and the second terminals, wherein each of the plurality of electrical-connection units is independent of the first terminal and the second terminal; and a first barrier layer comprising at least a plurality of first barrier units located between the first substrate and the second substrate in the first direction;

wherein each of the plurality of first barrier units is disposed to surround and contact a corresponding one of the plurality of electrical-connection units in a plan view of the display panel and wherein each of the plurality of first barrier units and the corresponding one of the plurality of electrical-connection units surrounded by the each of the plurality of first barrier units are both disposed in contact with a first inorganic film layer for moisture-oxygen barrier in the first substrate and both disposed in contact with a second inorganic film layer for moisture-oxygen barrier in the second substrate different from the first inorganic film layer, and wherein any adjacent ones of the plurality of first barrier units are spaced apart from each other, and each of the first and second substrates integrally extends across the plurality of first barrier units spaced apart from each other.

2. The display panel according to claim 1, wherein the second substrate comprises:

an insulating layer located on a side of each of the second terminals away from the first substrate, wherein the insulating layer comprises a plurality of first openings that respectively expose the second terminals;

a conductive line layer located in the plurality of first openings, wherein the conductive line layer is electrically connected to any of the second terminals; and a second barrier layer located on a side surface of the conductive line layer close to the first substrate, and wherein the second barrier layer comprises at least a plurality of second barrier units respectively disposed on sidewalls of the plurality of first openings.

3. The display panel according to claim 2, wherein the second substrate further comprises a first organic layer located on a side of the insulating layer close to the first substrate;

the first organic layer comprises a plurality of second openings and a plurality of third openings and the plurality of second openings and the plurality of third openings are disposed on a side of the first organic layer close to the first substrate and are spaced apart from each other; and the first barrier layer further comprises a plurality of third barrier units respectively filled in the plurality of third openings; and wherein the plurality of second openings respectively expose the second terminals, one of the plurality of first openings is corresponded with and connected to one of the plurality of second openings, and the plurality of third openings expose an inorganic film layer in the insulating layer.

4. The display panel according to claim 3, wherein the plurality of first barrier units are disposed integrally with the plurality of third barrier units.

5. The display panel according to claim 2, wherein the insulating layer comprises a first inorganic layer, a second inorganic layer, and a second organic layer located between the first inorganic layer and the second inorganic layer, and the second inorganic layer is located on a side of the second organic layer away from the first substrate; and wherein the plurality of second barrier units are disposed integrally with the second inorganic layer, and a material of each of the plurality of second barrier units is the same as that of the second inorganic layer.

6. The display panel according to claim 2, wherein a material of each of the plurality of second barrier units comprises any one or a combination of more than one of $SiO_2$, $ZrO_2$, $Al_2O_3$, $TiO_2$, Au, and Pt.

7. The display panel according to claim 1, wherein two adjacent ones of the plurality of first barrier units are disposed spaced apart from each other.

8. The display panel according to claim 7, wherein a width of each of the plurality of first barrier units gradually increases in a direction from a center of the display panel to edges of the display panel.

9. The display panel according to claim 7, wherein the display panel further comprises a flexible transparent unit located between two adjacent ones of the plurality of first barrier units.

10. The display panel according to claim 1, wherein two adjacent ones of the plurality of first barrier units are disposed in contact with each other.

11. The display panel according to claim 1, wherein a material of each of the plurality of first barrier units comprises any one or a combination of more than one of glass frit, epoxy resin, acrylate resin, polyurethane, organosilicon (e).

12. A display device comprising a display panel and a device main body, wherein the device main body is integrated with the display panel;

wherein the display panel comprises:

a first substrate, comprising first terminals at an upper surface of the first substrate;

a second substrate disposed opposite to the first substrate in a first direction perpendicular to the upper surface of the first substrate, wherein the second substrate comprises second terminals at a lower surface of the first second substrate close to the upper surface of the first substrate and a light emitting device layer connected to at least one of the second terminals;

a plurality of electrical-connection units respectively located between the first terminals and the second terminals in the first direction, to electrically connect the first substrate with the second substrate by electrically connecting the first terminals and the second terminals, wherein each of the plurality of electrical-connection units is independent of the first terminal and the second terminal; and a first barrier layer comprising at least a plurality of first barrier units located between the first substrate and the second substrate in the first direction;

wherein each of the plurality of first barrier units is disposed to surround and contact a corresponding one of the plurality of electrical-connection units in a plan view of the display panel and wherein each of the plurality of first barrier units and the corresponding one of the plurality of electrical-connection units surrounded by the each of the plurality of first barrier units are both disposed in contact with a first inorganic film layer for moisture-oxygen barrier in the first substrate and both disposed in contact with a second inorganic film layer for moisture-oxygen barrier in the second substrate different from the first inorganic film layer, and wherein any adjacent ones of the plurality of first barrier units are spaced apart from each other, and each of the first and second substrates integrally extends across the plurality of first barrier units spaced apart from each other.

13. The display device according to claim 12, wherein the second substrate comprises:

an insulating layer located on a side of each of the second terminals away from the first substrate, wherein the insulating layer comprises a plurality of first openings that respectively expose the second terminals;

a conductive line layer located in the plurality of first openings, wherein the conductive line layer is electrically connected to any of the second terminals; and a second barrier layer located on a side surface of the conductive line layer close to the first substrate, and wherein the second barrier layer comprises at least a plurality of second barrier units respectively disposed on sidewalls of the plurality of first openings.

14. The display device according to claim 13, wherein the second substrate further comprises a first organic layer located on a side of the insulating layer close to the first substrate;

the first organic layer comprises a plurality of second openings and a plurality of third openings and the plurality of second openings and the plurality of third openings are disposed on a side of the first organic layer close to the first substrate and are spaced apart from each other; and the first barrier layer further comprises a plurality of third barrier units respectively filled in the plurality of third openings; and wherein the plurality of second openings respectively expose the second terminals, one of the plurality of first openings is corresponded with and connected to one of the plurality of second openings, and the plurality of third openings expose an inorganic film layer in the insulating layer.

15. The display device according to claim 14, wherein the plurality of first barrier units are disposed integrally with the plurality of third barrier units.

16. The display device according to claim 13, wherein the insulating layer comprises a first inorganic layer, a second inorganic layer, and a second organic layer located between the first inorganic layer and the second inorganic layer, and the second inorganic layer is located on a side of the second organic layer away from the first substrate; and wherein the plurality of second barrier units are disposed integrally with the second inorganic layer, and a material of each of the plurality of second barrier units is the same as that of the second inorganic layer.

17. The display device according to claim 12, wherein two adjacent ones of the plurality of first barrier units are disposed spaced apart from each other.

18. The display device according to claim 17, wherein the display panel further comprises a flexible transparent unit located between two adjacent ones of the plurality of first barrier units.

19. The display panel according to claim 1, wherein the first barrier layer is disposed integrally with the first inorganic film layer or the second inorganic film layer.

\* \* \* \* \*